(12) United States Patent
Lin

(10) Patent No.: US 9,237,004 B2
(45) Date of Patent: Jan. 12, 2016

(54) CLOCK DATA RECOVERY CIRCUIT

(71) Applicant: HIMAX TECHNOLOGIES LIMITED, Tainan (TW)

(72) Inventor: Shih-Chun Lin, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 14/028,219

(22) Filed: Sep. 16, 2013

(65) Prior Publication Data

US 2015/0078427 A1    Mar. 19, 2015

(51) Int. Cl.
*H04L 7/033* (2006.01)
*H03L 7/087* (2006.01)
*H04L 7/00* (2006.01)

(52) U.S. Cl.
CPC ............... *H04L 7/033* (2013.01); *H03L 7/087* (2013.01); *H04L 7/0004* (2013.01)

(58) Field of Classification Search
CPC ............... H03L 7/06; H03L 7/07; H03L 7/08; H03L 7/0805; H03L 7/0807; H03L 7/081; H03L 7/0814; H03L 7/0816; H03L 7/0818; H03L 7/085; H03L 7/087; H03L 7/089; H03L 7/0891; H03L 7/0893; H03L 7/091; H03L 7/093; H03L 7/095; H03L 7/18; H03L 7/22; H03L 2207/06; H03L 2207/50; H04L 7/033; H04L 7/0331; H04L 7/0332; H04L 7/016; H04L 25/03; H04L 7/0004

USPC .......... 375/326, 327, 373–376; 327/147, 148, 327/151, 156, 157, 160
See application file for complete search history.

(56) References Cited

U.S. PATENT DOCUMENTS

| | | | |
|---|---|---|---|
| 4,943,788 A * | 7/1990 | Laws et al. ...................... 331/11 |
| 6,566,967 B1 * | 5/2003 | Anumula et al. ............... 331/11 |
| 2006/0104399 A1 * | 5/2006 | Byun et al. ..................... 375/376 |
| 2006/0215296 A1 * | 9/2006 | Latchman ........................ 360/51 |
| 2010/0034330 A1 * | 2/2010 | Weng et al. .................... 375/357 |
| 2010/0102888 A1 * | 4/2010 | Edwards et al. ................ 331/16 |
| 2012/0013374 A1 * | 1/2012 | Lin et al. ....................... 327/147 |
| 2012/0063556 A1 * | 3/2012 | Hoang ........................... 375/371 |
| 2012/0139593 A1 * | 6/2012 | Saito ............................. 327/156 |

* cited by examiner

*Primary Examiner* — Young T Tse
(74) *Attorney, Agent, or Firm* — J.C. Patents

(57) ABSTRACT

A clock data recovery circuit including a recovery unit and a loop control unit is provided. The recovery unit generates a recovery clock signal according to an original data signal. The recovery unit locks a frequency of the recovery clock signal to a correction frequency through a first loop, and locks the frequency of the recovery clock signal to a sampling frequency through a second loop. The correction frequency is smaller than the sampling frequency. The recovery unit adjusts the frequency of the recovery clock signal according to a reference clock signal and a first dividing signal in the first loop. The loop control unit switches the recovery unit to the first loop or the second loop according to a frequency difference between the reference clock signal and a second dividing signal.

10 Claims, 3 Drawing Sheets

CLOCK DATA RECOVERY CIRCUIT

BACKGROUND

1. Field of the Application

The invention relates to a clock data recovery circuit, and more particularly, to a clock data recovery circuit having two loops.

2. Description of Related Art

As for a high-speed serial transmission system, an original data signal undergoes attenuation and distortion in transmission. Therefore, a receiver of the transmission system often has to perform an appropriate recovery processing to the original data signal through a clock data recovery circuit. In terms of operation, the clock data recovery circuit may generate a periodic recovery clock signal, and may extract a recovery data signal from the original data signal through the recovery clock signal.

The circuit structure of the clock data recovery circuit may generally be divided into two types: one is a circuit structure with a reference clock signal, and the other is a circuit structure without a reference clock signal. In terms of the circuit structure with the reference clock signal, the conventional clock data recovery circuit often generates the reference clock signal by an on-chip oscillator, so as to lower hardware costs of the circuit.

However, a frequency of the on-chip oscillator often has an offset due to variations in process, voltage or temperature, and thus loops in the clock data recovery circuit are unable to be locked, thereby causing the clock data recovery circuit to extract incorrect data signals.

SUMMARY OF THE APPLICATION

The invention provides a clock data recovery circuit, which firstly locks a frequency of a recovery clock signal to a correction frequency, and then locks the frequency of the recovery clock signal to a sampling frequency higher that is than the correction frequency. Accordingly, the clock data recovery circuit is able to obtain a larger locking range, and thereby reduce extraction error caused by an offset of the reference clock signal.

The clock data recovery circuit of the invention includes a recovery unit and a loop control unit. The recovery unit generates the recovery clock signal according to an original data signal. Wherein, the recovery unit locks the frequency of the recovery clock signal to the correction frequency through a first loop and locks the frequency of the recovery clock signal to the sampling frequency through a second loop, and the correction frequency is smaller than the sampling frequency. Moreover, in the first loop, the recovery unit adjusts the frequency of the recovery clock signal according to the reference clock signal and a first dividing signal. The loop control unit switches the recovery unit to the first loop or the second loop according to a frequency difference between the reference clock signal and a second dividing signal.

In an embodiment of the invention, when the frequency of the recovery clock signal is locked to the sampling frequency, the recovery unit uses the recovery clock signal to sample the original data signal so as to generate a recovery data signal.

In an embodiment of the invention, a frequency of the first dividing signal is 1/N time of the frequency of the recovery clock signal, and a frequency of the second dividing signal is 1/M times of the frequency of the recovery clock signal. Wherein, N and M are positive integers, and M is greater than N.

According to the foregoing, the clock data recovery circuit of the invention uses the first loop to lock the frequency of the recovery clock signal to the correction frequency and uses the second loop to lock the frequency of the recovery clock signal to the sampling frequency that is higher than the correction frequency. Accordingly, the recovery unit is able to obtain the larger locking range, and thereby reduce the extraction error caused by the offset of the reference clock signal.

In order to make the aforementioned and other features and advantages of the present application more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
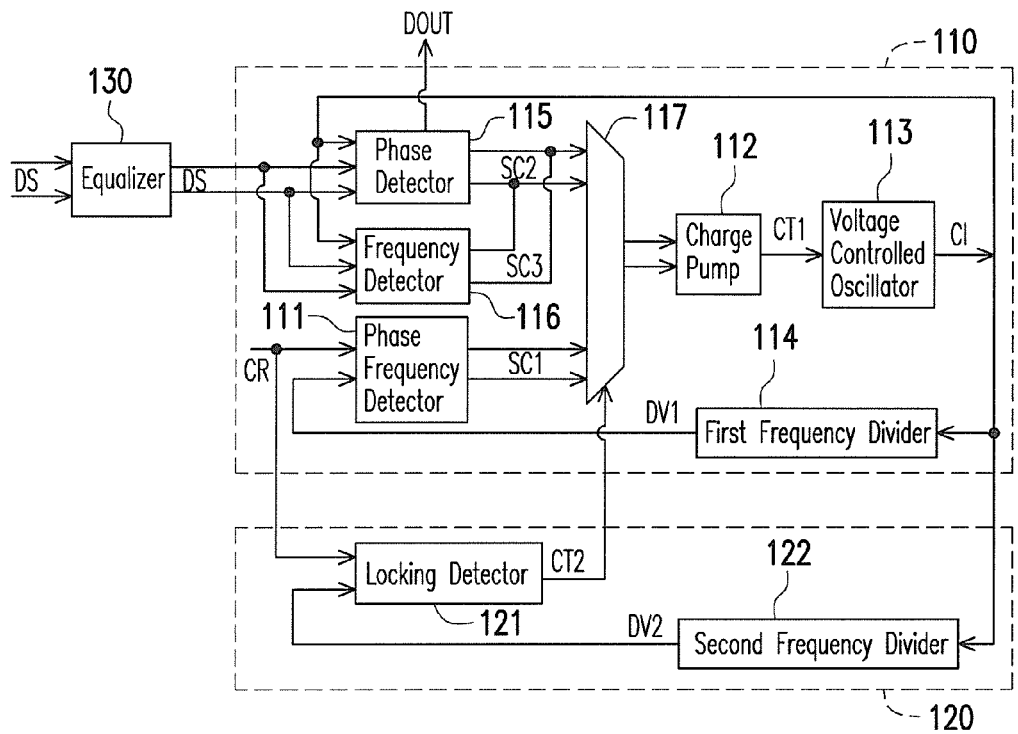
FIG. 1 is a schematic block diagram illustrating a clock data recovery circuit according to an embodiment of the invention.

FIG. 1 is a schematic block diagram illustrating a clock data recovery circuit according to an embodiment of the invention. As shown in FIG. 1, a clock data recovery circuit 100 includes a recovery unit 110 and a loop control unit 120. Wherein, the recovery unit 110 generates a recovery clock signal CI according to an original data signal DS. In the process of generating the recovery clock signal CI, the recovery unit 110 locks a frequency of the recovery clock signal CI to a correction frequency through a first loop and locks the frequency of the recovery clock signal CI to a sampling frequency through a second loop. Moreover, in the second loop, when the frequency of the recovery clock signal CI is locked to the sampling frequency, the recovery unit 110 samples an original data signal DS by the recovery clock signal CI, so as to generate a recovery data signal DOUT.

The clock data recovery circuit 100 illustrated in FIG. 1 is circuit structure with a reference clock signal. For example, in the first loop, the recovery unit 110 adjusts the frequency of the recovery clock signal CI according to a reference clock signal CR and a first dividing signal DV1. Wherein, the reference clock signal CR may be provided by an on-chip oscillator. On the other hand, the loop control unit 120 switches the recovery unit 110 to the first loop or the second loop according to a frequency difference between the reference clock signal CR and a second dividing signal DV2.

Noteworthily, the correction frequency is smaller than the sampling frequency. Namely, before the recovery clock signal CI is locked to the sampling frequency, the recovery unit 110 firstly locks the recovery clock signal CI to the correction frequency, which is lower than the sampling frequency. Accordingly, the frequency of the recovery clock signal CI may be maintained within a locking range of the second loop, and thereby enable the recovery unit 110 to obtain a larger locking range. As a result, with an extension of the locking range of the recovery unit 110, extraction error caused by an offset of the reference clock signal CR may be reduced.

The loop control unit 120 includes a locking detector 121 and a second frequency divider 122. Wherein, the second frequency divider 122 divides the recovery clock signal CI by M so as to generate the second dividing signal DV2, wherein M is a positive integer. Namely, the second frequency divider 122 performs M-times division. The locking detector 121 detects a frequency difference between the reference clock signal CR and the second dividing signal DV2. Moreover, the locking detector 121 determines whether the detected frequency difference is within a preset frequency range and switches a level of a loop control signal CT2 according to the determined result.

For example, when the frequency difference is not within in the preset frequency range, namely when the recovery clock signal CI is not sufficiently stable, the locking detector 121 switches the loop control signal CT2 to a first level. Moreover, the recovery unit 110 is switched to the first loop according to the loop control signal CT2 with the first level, and locks the frequency of the recovery clock signal CI to the correction frequency through the first loop. On the contrary, when the frequency difference is within the preset frequency range, the locking detector 121 switches the loop control signal CT2 to a second level. Moreover, the recovery unit 110 is switched to the second loop according to the loop control signal CT2 with the second level, and locks the frequency of the recovery clock signal CI to the sampling frequency through the second loop.

The recovery unit 110 includes a phase frequency detector 111, a charge pump 112, a voltage controlled oscillator 113, a first frequency divider 114, a phase detector 115, a frequency detector 116 and a multiplexer 117. The phase detector 115 and the frequency detector 116 are connected in parallel with each other, and the multiplexer 117 is electrically connected to an output terminal of the phase detector 115, an output terminal of the phase frequency detector 111 and an input terminal of the charge pump 112. Moreover, the voltage controlled oscillator 113 is electrically connected to the charge pump 112, and the first frequency divider 114 is electrically connected between the voltage controlled oscillator 113 and the phase frequency detector 111.

Figure 2:
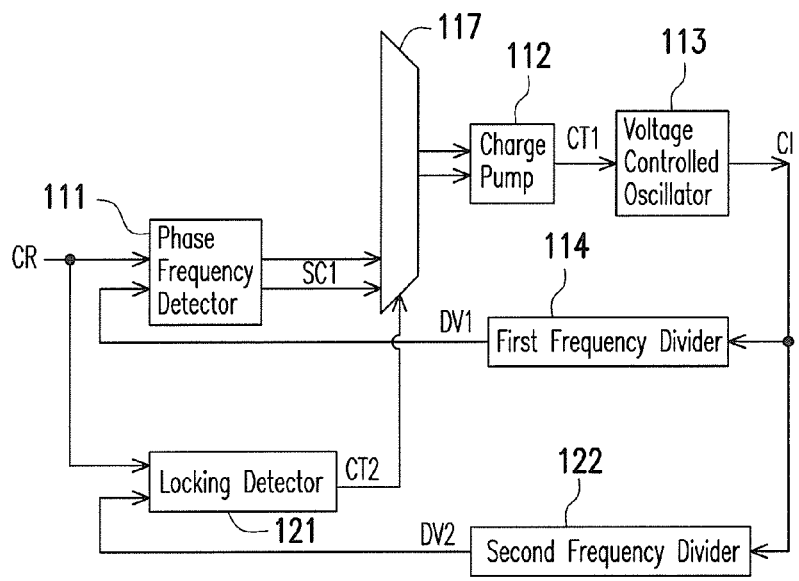
FIG. 2 is a schematic block diagram illustrating a clock data recovery circuit below a first loop according to an embodiment of the invention.

In terms of operation, the multiplexer 117 connects the input terminal of the charge pump 112 to the output terminal of the phase frequency detector 111 or the output terminal of the phase detector 115 according to the loop control signal CT2 from the loop control unit 120. For example, when the loop control signal CT2 is switched to the first level, the multiplexer 117 connects the input terminal of the charge pump 112 to the output terminal of the phase frequency detector 111. At this time, as shown in FIG. 2, the recovery unit 110 is capable of forming the first loop through the phase frequency detector 111, the charge pump 12, the voltage controlled oscillator 113 and the first frequency divider 114. Namely, the clock data recovery circuit 100 is switched to a phase-locked loop mode. Wherein, FIG. 2 is a schematic block diagram illustrating a clock data recovery circuit below a first loop according to an embodiment of the invention.

Continuously referring to FIG. 2, in the first loop, the phase frequency detector 111 detects the phase difference and the frequency difference between the reference clock signal CR and the first dividing signal DV1, and generates a first pulse signal SC1 according to the detection results. Moreover, the charge pump 112 performs charging or discharging according to the first pulse signal SC1 so as to generate a clock control signal CT1. Furthermore, the voltage controlled oscillator 113 generates the recovery clock signal CI, and adjusts the frequency of the recovery clock signal CI according to the clock control signal CT1. The first frequency divider 114 divides the recovery clock signal CI by N so as to generate the first dividing signal DV1, wherein N is a positive integer and N is not equal to M. Namely, the first frequency divider 114 performs N-times division.

Moreover, the first dividing signal DV1 is transmitted to the phase frequency detector 111, and thereby enables the recovery unit 110 to continuously adjust the frequency of the recovery clock signal CI according to the reference clock signal CR and the first dividing signal DV1. Accordingly, the recovery unit 110 locks the frequency of the recovery clock signal CI to the correction frequency through the first loop. When the frequency of the recovery clock signal CI is locked to the correction frequency, the frequency difference between the reference clock signal CR and the second dividing signal DV2 falls within the preset frequency range. At this time, the loop control unit 120 switches the loop control signal CT2 from the first level to the second level.

Figure 3:
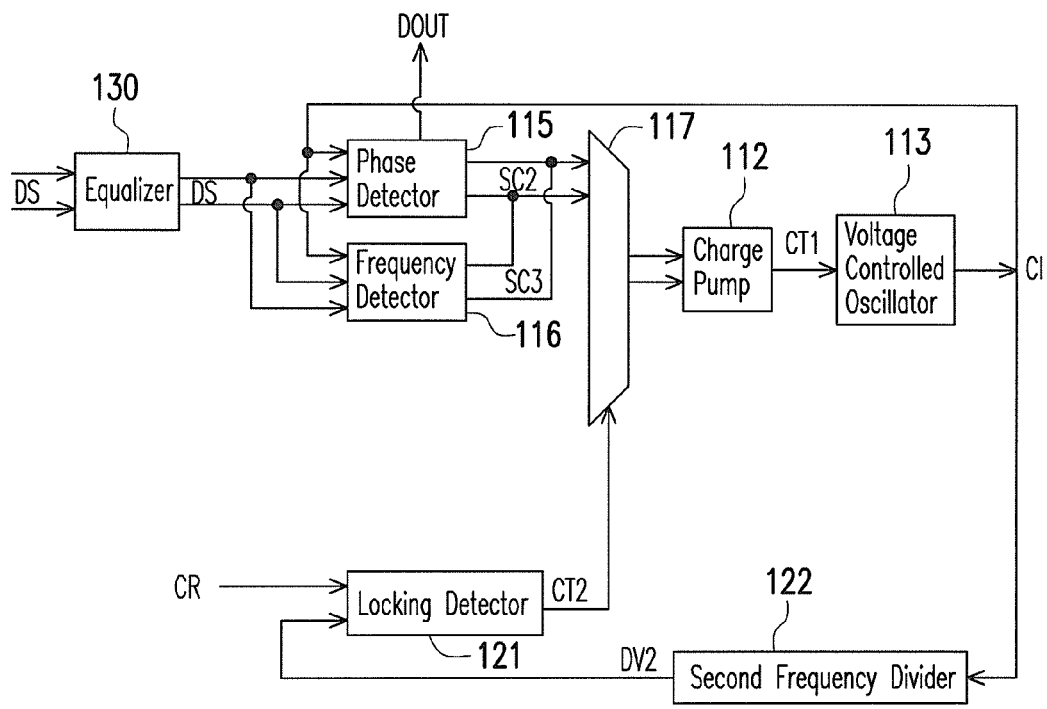
FIG. 3 is a schematic block diagram illustrating a clock data recovery circuit below a second loop according to an embodiment of the invention.

When the loop control signal CT2 is switched to the second level, the multiplexer 117 connects the input terminal of the charge pump 112 to the output terminal of the phase detector 115. At this time, as shown in FIG. 3, the recovery unit 110 is capable of forming the second loop through the phase detector 115, the frequency detector 116, the charge pump 112 and the voltage controlled oscillator 113. Namely, the clock data recovery circuit 100 is switched to a clock data recovery mode. Wherein, FIG. 3 is a schematic block diagram illustrating a clock data recovery circuit below a second loop according to an embodiment of the invention.

Figure 4:
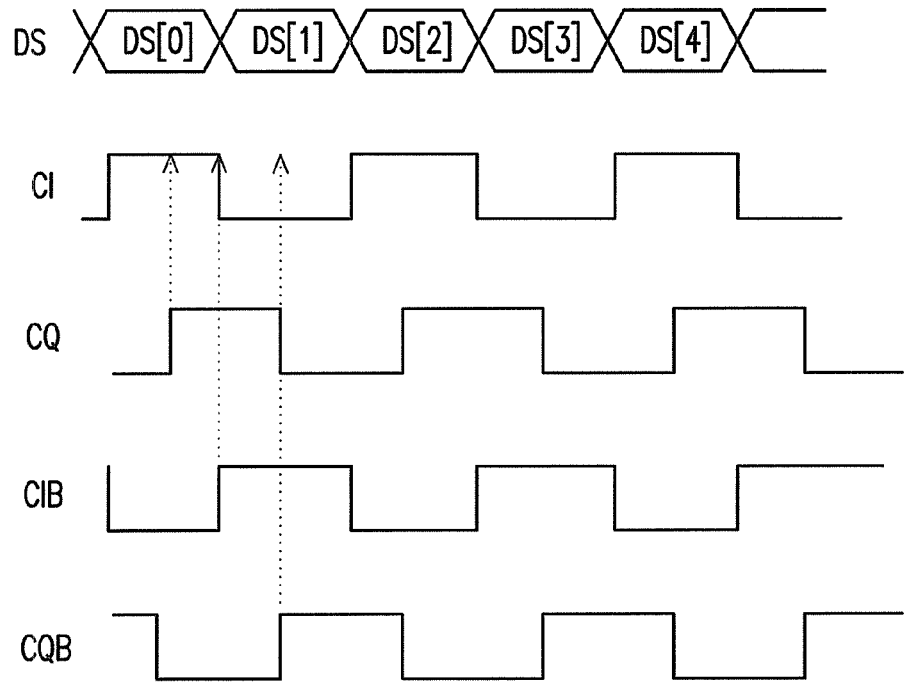
FIG. 4 is a schematic diagram illustrating a signal timing of a clock data recovery circuit according to an embodiment of the invention.

Noteworthily, the voltage controlled oscillator 113, in addition to generating the recovery clock signal CI, also generates a shift clock signal CQ. Wherein, the frequency of the recovery clock signal CI is the same with the frequency of the shift clock signal CQ, and a phase difference between the recovery clock signal CI and the shift clock signal CQ is 45 degree. Accordingly, as shown in FIG. 4, in an embodiment, the sampling frequency may, for example, be 0.5 times of the frequency of the original data signal DS. Therefore, the phase detector 115 may determine whether to extract the middle portion of the data (such as: DS[0] to DS[4]) according to the shift clock signal CQ and an inverted signal CQB of the shift clock signal CQ. Moreover, when the recovery clock signal CI is locked to the sampling frequency, the phase detector 115 is able to sample the original data signal DS twice within a clock period. Wherein, FIG. 4 is a schematic diagram illustrating a signal timing of a clock data recovery circuit according to an embodiment of the invention.

Figure 5:
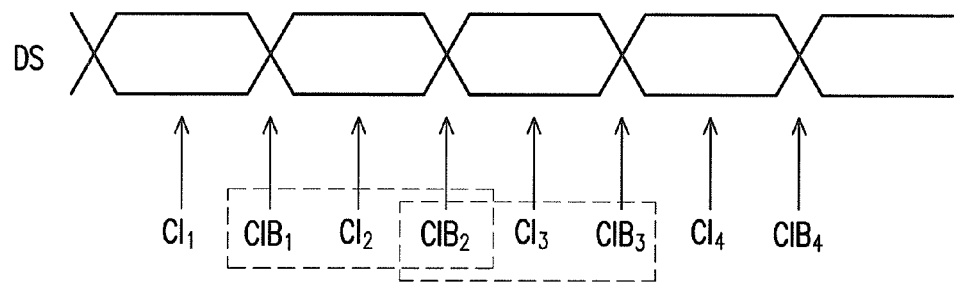
FIG. 5 is a schematic diagram illustrating a signal timing of a phase detector according to an embodiment of the invention.

Continuously referring to FIG. 3. In order to lock the recovery clock signal CI to the sampling frequency, in the second loop, the phase detector 115 uses the recovery clock signal CI and an inverted signal CIB of the recovery clock signal CI to sample the original data signal DS, so as to generate a second pulse signal SC2. For example, FIG. 5 is a schematic diagram illustrating a signal timing of a phase detector according to an embodiment of the invention, wherein $CI_1$ to $CI_4$ represent sample values obtained by using the recovery clock signal CI, and $CIB_1$ to $CIB_4$ represent sample values obtained by using the inverted signal CIB.

In terms of operation, the phase detector 115 sequentially compares differences between the continuous sampling values. For instance, the phase detector 115 compares the differences between the sampling values ($CIB_1$, $CI_2$ and $CIB_2$) and successively compares the differences between the sampling values ($CIB_2$, $CI_3$ and $CIB_3$), and so forth. When $CIB_1$ is not equal to $CI_2$ and $CI_2$ equals to $CIB_2$, it means that the recovery clock signal CI leads the original data signal DS. Relatively, when $CIB_1$ equals $CI_2$ and $CI_2$ is not equal to $CIB_2$, it represents that the recovery clock signal CI lags behind the original data signal DS. Moreover, the phase detector 115 generates the second pulse signal SC2 according to the comparison results.

On the other hand, the frequency detector 116 uses the recovery clock signal CI, the shift clock signal CQ and the inverted signal CQB of the shift clock signal CQ to sample the original data signal DS, so as to generate a third pulse signal SC3. For example, FIG. 6A and FIG. 6B respectively are schematic diagrams illustrating a signal timing of a frequency detector according to an embodiment of the invention, wherein $CQB_5$ represents a sampling value obtained by using the inverted signal CQB, $CI_5$ represents a sampling value obtained by using the recovery clock signal CI, and $CQ_5$ represents a sampling value obtained by using the shift clock signal CQ.

Figure 6A:
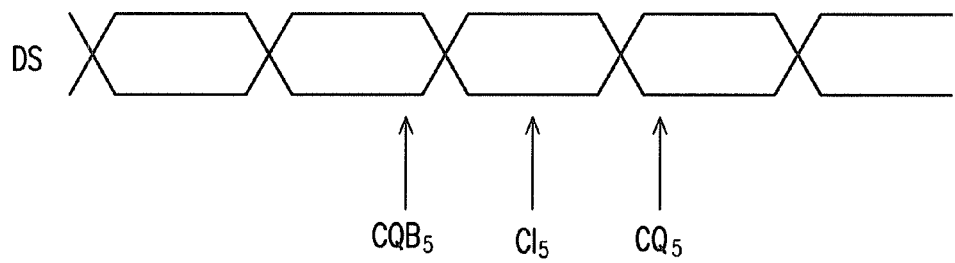
FIG. 6A and FIG. 6B respectively are schematic diagrams illustrating a signal timing of a frequency detector according to an embodiment of the invention.
Figure 6B:
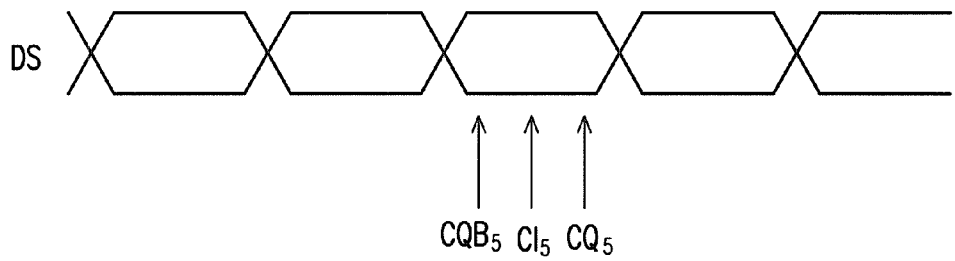

In terms of operation, the frequency detector 116 sequentially compares differences between the continuous sampling values. For instance, the frequency detector 116 compares the differences between the sampling values ($CQB_5$, $CI_5$ and $CQ_5$). Wherein, as shown in FIG. 6A, when $CQB_5$ is not equal to $CI_5$ and $CQB_5$ equals to $CQ_5$, it represents that the frequency of the recovery clock signal CI is too low. Relatively, when $CQB_5$, $CI_5$ and $CQ_5$ are equal to one another, it represents that the frequency of the recovery clock signal CI is too high. Moreover, the frequency detector 116 generates the third pulse signal SC3 according to the comparison results.

Noteworthily, when the data in the original data signal DS are identical, the frequency detector 116 will misjudge the frequency of the recovery clock signal CI as being too high. However, in the present embodiment, since the frequency of the recovery clock signal CI in the second loop is locked from the lower correction frequency to the higher sampling frequency, the frequency of the recovery clock signal CI in the second loop may be prevented from being too high and thereby avoiding a misjudgement of the frequency detector 116.

Continuously referring to FIG. 3. In the second loop, the second pulse signal SC2 and third pulse signal SC3 are both transmitted to the charge pump 112. Moreover, the charge pump 112 performs charging or discharging according to the second pulse signal SC2 and third pulse signal SC3, so as to generate the clock control signal CT1. Furthermore, the voltage controlled oscillator 113 adjusts the frequency of the recovery clock signal CI according to the clock control signal CT1, and then transmits the adjusted recovery clock signal CI back to the phase detector 115 and the frequency detector 116. Accordingly, the recovery unit 110 is able to lock the frequency of the recovery clock signal CI from the correction frequency to the sampling frequency through the second loop.

Noteworthily, the first frequency divider 114 and the second frequency divider 122 respectively perform different times of division to the recovery clock signal CI. Therefore, a frequency of the first dividing signal DV1 is 1/N times of the frequency of the recovery clock signal CI, and a frequency of the second dividing signal DV2 is 1/M times of the frequency of the recovery clock signal CI. Moreover, in the present embodiment, M is greater than N. Therefore, in the process of locking the recovery clock signal CI from the lower correction frequency to the higher sampling frequency, a frequency difference between the reference clock signal CR and the second dividing signal DV2 still falls within the preset frequency range, and thereby ensures the recovery unit 110 is maintained in the second loop.

Moreover, in the second loop, when the frequency of the recovery clock signal CI is locked to the sampling frequency, the recovery unit 110 uses the recovery clock signal CI to sample the original data signal DS, so as to generate the recovery data signal DOUT. Relatively, when the frequency difference between the reference clock signal CR and the second dividing signal DV2 is not within the preset frequency range, the loop control unit 120 switches the loop control signal CT2 from the second level to the first level, so as to switch the recovery unit 110 to the first loop.

It should be noted that, the preset frequency range of the locking detector 121 is related to a tolerance of the clock data recovery circuit 100 for an offset of the reference clock signal CR. For example, if the clock data recovery circuit 100 is tolerant to the reference clock signal CR with the offset of +20%, namely if a frequency of the reference clock signal CR is shifted from 27 MHz to 32.4 MHz, the frequency of the recovery clock signal CI is still locked to the sampling frequency, so that a frequency of the second dividing signal DV2 is adjusted to 27 MHz. In other words, the preset frequency range of the locking detector 121 must cover a variation of 83% (27/32.4) in response to the the offset of +20% in the reference clock signal CR.

By contrast, if the clock data recovery circuit 100 is tolerant to the reference clock signal CR with the offset of −20%, namely if the frequency of the reference clock signal CR is shifted from 27 MHz to 21.6 MHz, the frequency of the recovery clock signal CI is still locked to the sampling frequency, so that the frequency of the second dividing signal DV2 is adjusted to 27 MHz. In other words, the preset frequency range of the locking detector 121 must cover a variation of 125% (27/21.6) in response to the the offset of −20% in the reference clock signal CR.

Furthermore, as shown in FIG. 3, in an embodiment, the clock data recovery circuit 100 further includes an equalizer 130. Wherein, the equalizer 130 is configured to amplify the original data signal DS. Moreover, the equalizer 130 transmits the amplified original data signal DS to the recovery unit 110 for being judged by the recovery unit 110. Wherein, the equalizer 130 is mainly configured to amplify the high-frequency signal in the original data signal DS.

In summary, the clock data recovery circuit of the invention uses the first loop to lock the frequency of the recovery clock signal to the correction frequency, and then uses the second loop to lock the frequency of the recovery clock signal to the sampling frequency that is higher than the correction frequency. Accordingly, the frequency of the recovery clock signal may be ensured within the locking range of the second loop, and thereby the recovery unit is able to obtain the larger locking range. Moreover, with the expansion of the locking range of the recovery unit, the extraction error caused by the offset of the reference clock signal may be reduced.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A clock data recovery circuit comprising:
a recovery unit generating a recovery clock signal according to an original data signal, wherein the recovery unit comprises a first frequency divider, the first frequency divider divides a frequency of the recovery clock signal by N to generate a first dividing signal, and N is a positive integer; and
a loop control unit comprising a second frequency divider and a locking detector, wherein the second frequency divider divides the frequency of the recovery clock signal by M to generate a second dividing signal, and the locking detector detects a frequency difference between a reference clock signal and the second dividing signal, M is positive integer and M is greater than N,
when the frequency difference between the reference clock signal and the second dividing signal is not within a preset frequency range, the loop control unit switches the recovery unit to a first loop, and the recovery unit adjusts the frequency of the recovery clock signal according to the reference clock signal and the first dividing signal, so as to lock the frequency of the recovery clock signal to a correction frequency, and
when the frequency difference between the reference clock signal and the second dividing signal is within the preset frequency range, the loop control unit switches the recovery unit to a second loop, and the frequency of the recovery clock signal is locked to a sampling frequency from the correction frequency in response to the second loop, wherein the correction frequency is smaller than the sampling frequency.

2. The clock data recovery circuit as recited in claim 1, wherein when the frequency of the recovery clock signal is locked to the sampling frequency, the recovery unit samples the original data signal by the recovery clock signal so as to generate a recovery data signal.

3. The clock data recovery circuit as recited in claim 1, wherein the recovery unit further comprises:
a phase frequency detector detecting a phase difference and a frequency difference between the reference clock signal and the first dividing signal, and generating a first pulse signal according to a detection result;
a charge pump, wherein the charge pump performs charging or discharging in the first loop according to the first pulse signal so as to generate a clock control signal; and
a voltage controlled oscillator generating the recovery clock signal, and adjusting the frequency of the recovery clock signal according to the clock control signal.

4. The clock data recovery circuit as recited in claim 3, wherein the voltage controlled oscillator further generate a shift clock signal, and the recovery unit further comprises:
a phase detector using the recovery clock signal and an inverted signal of the recovery clock signal to sample the original data signal, so as to generate a second pulse signal; and
a frequency detector connected in parallel with the phase detector, and sampling the original data signal by the recovery clock signal, the shift clock signal and an inverted signal of the shift clock signal, so as to generate a third pulse signal, wherein the charge pump performs charging or discharging in the second loop according to the second pulse signal and the third pulse signal so as to generate the clock control signal.

5. The clock data recovery circuit as recited in claim 4, wherein the recovery unit further comprises:
a multiplexer electrically connected to an output terminal of the phase frequency detector, an output terminal of the phase detector and an input terminal of the charge pump, and the multiplexer connecting the input terminal of the charge pump to the output terminal of the phase frequency detector or the output terminal of the phase detector according to a loop control signal from the loop control unit.

6. The clock data recovery circuit as recited in claim 5, wherein when the loop control signal is switched to a first level, the multiplexer connects the input terminal of the charge pump to the output terminal of the phase frequency detector for enabling the recovery unit to form the first loop, and when the loop control signal is switched to a second level, the multiplexer connects the input terminal of the charge pump to the output terminal of the phase detector for enabling the recovery unit to form the second loop.

7. The clock data recovery circuit as recited in claim 6, wherein when the frequency difference between the reference clock signal and the second dividing signal is not within the preset frequency range, the loop control unit switches the loop control signal to the first level, and when the frequency difference between the reference clock signal and the second dividing signal is within the preset frequency range, the loop control unit switches the loop control signal to the second level.

8. The clock data recovery circuit as recited in claim 1, wherein
the locking detector determines whether the frequency difference between the reference clock signal and the second dividing signal is within the preset frequency range, and switches the level of a loop control signal according to a determined result.

9. The clock data recovery circuit as recited in claim 8, wherein when the frequency difference between the reference clock signal and the second dividing signal is not within the preset frequency range, the locking detector switches the loop control signal to a first level for enabling the recovery unit to be switched to the first loop, and when the frequency difference between the reference clock signal and the second dividing signal is within the preset frequency range, the locking detector switches the loop control signal to a second level for enabling the recovery unit to be switched to the second loop.

10. The clock data recovery circuit as recited in claim 1 further comprising:
an equalizer configured to amplify the original data signal.

* * * * *